United States Patent
Reboud et al.

(10) Patent No.: US 11,251,339 B2
(45) Date of Patent: Feb. 15, 2022

(54) PROCESS FOR FABRICATING AN OPTOELECTRONIC DEVICE FOR EMITTING INFRARED LIGHT COMPRISING A GESN-BASED ACTIVE LAYER

(71) Applicant: Commissariat A L'Energie Atomique et aux Energies Alternatives, Paris (FR)

(72) Inventors: Vincent Reboud, Grenoble (FR); Alexei Tchelnokov, Grenoble (FR); Julie Widiez, Grenoble (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 16/583,705

(22) Filed: Sep. 26, 2019

(65) Prior Publication Data

US 2020/0343414 A1   Oct. 29, 2020

(30) Foreign Application Priority Data

Sep. 28, 2018 (FR) .................................. 18 58948

(51) Int. Cl.
*H01L 33/40* (2010.01)
*H01L 33/00* (2010.01)
(Continued)

(52) U.S. Cl.
CPC .......... *H01L 33/40* (2013.01); *H01L 33/0054* (2013.01); *H01L 33/34* (2013.01); *H01S 5/18361* (2013.01); *H01S 5/3432* (2013.01)

(58) Field of Classification Search
None
See application file for complete search history.

(56) References Cited

U.S. PATENT DOCUMENTS

2003/0012249 A1* 1/2003 Eisenbeiser ........... H01S 5/0261
372/96
2004/0061117 A1   4/2004 Picard et al.
(Continued)

FOREIGN PATENT DOCUMENTS

| FR | 3 041 812 A1 | 3/2017 |
| WO | WO 03/050887 A2 | 6/2003 |
| WO | WO 03/050887 A3 | 6/2003 |

OTHER PUBLICATIONS

French Preliminary Search Report dated Jul. 11, 2019 in French Application 18 58948 filed on Sep. 28, 2018 (with English Translation of Categories of Cited Documents & Written Opinion ).
(Continued)

*Primary Examiner* — Bilkis Jahan
(74) *Attorney, Agent, or Firm* — Oblon, McClelland, Maier & Neustadt, L.L.P.

(57) ABSTRACT

A process for fabricating an optoelectronic device for emitting infrared radiation, including:
i) producing a first stack containing a light source, and a first bonding sublayer made from a metal of interest chosen from gold, titanium and copper,
ii) producing a second stack containing a GeSn-based active layer obtained by epitaxy at an epitaxy temperature ($T_{epi}$), and a second bonding sublayer made from the metal of interest,
iii) determining an assembly temperature (Tc) substantially between an ambient temperature ($T_{amb}$) and the epitaxy temperature ($T_{epi}$), such that a direct bonding energy per unit area of the metal of interest is higher than or equal to 0.5 $J/m^2$; and
iv) joining, by direct bonding, at the assembly temperature (Tc), the stacks.

11 Claims, 6 Drawing Sheets

(51) Int. Cl.
*H01L 33/34* (2010.01)
*H01S 5/183* (2006.01)
*H01S 5/343* (2006.01)

(56) References Cited

U.S. PATENT DOCUMENTS

| | | | | |
|---|---|---|---|---|
| 2012/0104462 A1* | 5/2012 | Ichikawa | ............ | H01L 29/7786 257/194 |
| 2014/0273323 A1* | 9/2014 | Kim | ............ | H01S 5/3409 438/47 |
| 2015/0014632 A1* | 1/2015 | Kim | ............ | H01L 29/0817 257/24 |
| 2017/0092809 A1* | 3/2017 | Reboud | ............ | H01L 33/0012 |
| 2017/0263736 A1 | 9/2017 | Kim | | |
| 2019/0115459 A1 | 4/2019 | Kim | | |
| 2019/0296131 A1* | 9/2019 | Kim | ............ | H01L 29/267 |

OTHER PUBLICATIONS

Matthews, J, et al., "Defects in Epitaxial Multilayers", Journal of Crystal Growth 27 (1974), pp. 118-125.
Maree, P, et al., "Generation of misfit dislocations in semiconductors", Journal of Applied Physics 62, 4413 (1987), pp. 4413-4420.
Wirths, S, et al., "Lasing in direct-bandgap GeSn alloy grown on Si", Nature Photonics, vol. 9, 2015, pp. 88-92.
Wirths, S, et al., "Optically Pumped GeSn Microdisk Lasers on Si", ACS Photonics, 3 (7),2016, 23 pages.
Thai, Q, et al., "Lasing effect in GeSn photonic crystal", IEEE, 2018, 2 pages.
Reboud, V, et al., "Optically pumped GeSn micro-disks with 16% Sn lasting at 3.1 μm up to 180 K", Applied Physics Letters 111, 092101 (2017), 4 pages.
Wirths, S, et al., "Strain Engineering for Direct Bandgap GeSn Alloys", IEEE, 2014, 2 pages.

\* cited by examiner

PROCESS FOR FABRICATING AN OPTOELECTRONIC DEVICE FOR EMITTING INFRARED LIGHT COMPRISING A GESN-BASED ACTIVE LAYER

TECHNICAL FIELD

The field of the invention is that of the fabrication of optoelectronic devices for emitting infrared light, and more particularly middlewave-infrared (MWIR) light, comprising an active layer based on germanium-tin (GeSn).

PRIOR ART

Optoelectronic devices for emitting infrared light may comprise an optically active layer based on a crystalline semiconductor compound from column IV of the periodic table of the elements, for example an alloy based on germanium-tin (GeSn). The layer is said to be active in so far as it generates most of the infrared light radiation emitted by the optoelectronic device. Specifically, germanium-tin ($Ge_{1-x}Sn_x$) may have a direct electronic-band structure propitious for the emission of infrared light radiation when the atomic proportion of tin $x_{sn}$ is sufficient.

Production of such a GeSn-based active layer however remains tricky, notably because of the large difference between the lattice parameter of germanium ($a_{Ge}$=5.658 Å) and that of tin ($a_{Sn}$=6.489 Å), and of the difference between the melting point of germanium (about 950° C.) and that of tin (about 240° C.) which may lead to demixing of the tin.

With the aim of fabricating such an optoelectronic device, one approach consists in producing a partially relaxed GeSn active layer by epitaxial growth, from a germanium virtual-substrate. In this respect, the publication by Wirths et al. entitled *Lasing in direct-bandgap GeSn alloy grown on Si*, Nature Photon. 9, 88-92 (2015) describes a process for fabricating an optoelectronic device in which an active layer made from germanium-tin (GeSn) is produced by epitaxial CVD growth on a nucleation layer made from quasi-relaxed germanium (Ge) formed on a silicon (Si) substrate. A thick active layer made from germanium-tin (GeSn) is formed by epitaxy on the nucleation layer, and has a sufficient thickness for the mechanical strains to relax plastically and for the germanium-tin, in at least one thickness of the active layer, to be quasi-relaxed. The active layer thus produced also has a relatively good crystal quality, except at the interface with the nucleation layer where the plastic relaxation of the mechanical strains generates structural defects of the dislocation type. The authors show that an atomic proportion of tin of 12.6% allows the electronic-band structure of a relaxed GeSn layer to be made direct and thus infrared light radiation to be emitted.

Another approach consists in producing a GeSn-based active layer that is mechanically strained tensilely in the plane of the layer. Specifically, as the publication by Wirths et al. entitled *Strain Engineering for Direct Bandgap GeSn Alloys*, IEEE 11th International Conference On Group IV Photonics, 2014, notably shows, the minimum atomic proportion of tin $x_{Sn}$ present in the GeSn-based active layer depends on the type (compressive, tensile) and intensity of the mechanical strains applied to the active layer. Decreasing this minimum atomic proportion of tin $x_{Sn}$ allows the risk of demixing of the tin to be decreased. In this respect, international patent application WO2018037189 describes a process for fabricating an optoelectronic device for emitting infrared light with a GeSn-based active layer, the latter being obtained in the form of a membrane suspended above a substrate and tensilely strained by tensioning arms, then joined by direct bonding to the substrate by collapsing the membrane.

SUMMARY OF THE INVENTION

The objective of the invention is to at least partially remedy the drawbacks of the prior art, and more particularly to provide a process for fabricating an optoelectronic device for emitting infrared light comprising a GeSn-based active layer, the GeSn being of good crystal quality irrespectively of whether it is quasi-relaxed or tensilely strained, and that furthermore allows the risk of demixing of the tin contained in the active layer to be limited.

To this end, one subject of the invention is a process for fabricating an optoelectronic device for emitting infrared light radiation, comprising the following steps:

i) producing a first stack comprising:
  a light source of exciting light radiation,
  a first bonding sublayer made from a metal of interest chosen from gold, titanium and copper, having a first contact face,
  between which is placed a first binding layer made from a material that is transparent to the exciting light radiation;

ii) producing a second stack comprising:
  a GeSn-based active layer obtained by epitaxial growth at an epitaxy temperature and suitable for absorbing the exciting light radiation and for emitting in response the infrared light radiation,
  a second bonding sublayer made from said metal of interest, having a second contact face,
  between which is placed a second binding layer made from a material that is transparent to the exciting light radiation;

iii) determining an assembly temperature substantially comprised between an ambient temperature and said epitaxy temperature, such that a direct bonding energy per unit area of said metal of interest is higher than or equal to 0.5 $J/m^2$;

iv) joining, by direct bonding, at said assembly temperature, said stacks via said contact faces.

The GeSn-based active layer has an atomic proportion of tin such that it, or more precisely the GeSn-based material of the active layer, has a substantially direct electronic-band structure.

The following are preferred but nonlimiting aspects of this process.

The fabricating process may comprise:
  a phase of structuring the first bonding sublayer and/or the second bonding sublayer thicknesswise, so that the metal intermediate layer formed by said bonding sublayers when joined to each other comprises at least one periodic grating, the metal intermediate layer having a nonzero minimum thickness;
  a phase of determining, prior to the structuring phase, geometric parameters of the periodic grating, so that the metal intermediate layer has a coefficient of transmission of the exciting light radiation of a value higher than a preset value corresponding to an equivalent planar metal intermediate layer without periodic grating and of a constant thickness equal to said minimum thickness.

The periodic grating may be located at the interface with the first and/or second binding layers, said contact faces being planar.

The metal intermediate layer may comprise at least one continuous portion of a constant first thickness equal to the minimum thickness, and pads arranged to protrude with respect to the continuous portion and forming the periodic grating.

The exciting light source may be a light-emitting diode or a vertical-cavity-surface-emitting-laser source.

The exciting light source may be a vertical-cavity-surface-emitting-laser source comprising a lower reflector and an upper reflector between which a gain medium is placed, the upper reflector making contact with and being covered by the first binding layer. The process may then comprise:
  a phase of determining, prior to the phase of producing the first stack, a thickness of the first binding layer, so that an equivalent reflector formed by the upper reflector and by the metal intermediate layer, separated from each other by the first binding layer, has a coefficient of reflection of the exciting light radiation of a value higher than a preset value.

The assembly temperature may be lower than or equal to the epitaxy temperature to within 10%.

The transparent material of the binding layers may be a dielectric.

The transparent material of the binding layers may be silicon-based.

The two bonding sublayers when joined to each other form a metal intermediate layer that may have an average thickness comprised between 5 nm and 40 nm.

The fabricating process may comprise a step of structuring the GeSn-based active layer, so as to form a resonant cavity oriented in the plane of the active layer, i.e. such that an optical mode may propagate through the resonant cavity in the plane of the active layer.

The invention also relates to an optoelectronic device for emitting infrared light radiation, comprising a stack of:
  a light source of exciting light radiation;
  a first bonding sublayer made from a metal of interest chosen from gold, titanium and copper, having a first contact face;
  a first binding layer made from a material that is transparent to the exciting light radiation, which layer is placed between the light source and the first bonding sublayer;
  a second bonding sublayer made from said metal of interest, having a second contact face joined to and making contact with the first contact face;
  a GeSn-based active layer suitable for absorbing the exciting light radiation and for emitting in response the infrared light radiation;
  a second binding layer made from a material that is transparent to the exciting light radiation, which layer is placed between the active layer and the second bonding sublayer.

The first bonding sublayer and/or the second bonding sublayer may be structured thicknesswise so that the metal intermediate layer, formed by said bonding sublayers when joined to each other, comprises at least one periodic grating and has a nonzero minimum thickness. The periodic grating may be defined by geometric parameters such that the metal intermediate layer has a coefficient of transmission of the exciting light radiation of a value higher than a value corresponding to an equivalent planar metal intermediate layer without periodic grating and of a constant thickness equal to said minimum thickness.

BRIEF DESCRIPTION OF THE DRAWINGS

Other aspects, aims, advantages and features of the invention will become more clearly apparent on reading the following detailed description of preferred embodiments thereof, which description is given by way of nonlimiting example and with reference to the appended drawings, in which.

DETAILED DESCRIPTION OF PARTICULAR EMBODIMENTS

In the figures and in the rest of the description, the same references have been used to reference elements that are identical or similar. In addition, the various elements are not shown to scale in order to make the figures clearer. Moreover, the various embodiments and variants are not exclusive of one another and may be combined together. Unless otherwise indicated, the terms "substantially", "about" and "of the order of" mean to within 10%, and preferably to within 5%. Moreover, the expression "comprised between . . . and . . . " and equivalent expressions mean that the limits are included, unless otherwise mentioned.

The invention relates to a process for fabricating an optoelectronic device for emitting infrared light comprising an active layer based on germanium-tin (GeSn) of high crystal quality, which layer is placed facing a light source of exciting light radiation. The optoelectronic device may be a device for emitting incoherent light or coherent light. The emitted light is located in the infrared spectral range, and more precisely in the middlewave-infrared spectral range (central wavelength $\lambda_2$ preferably comprised between about 2 µm and 6 µm). The fabricating process comprises a step of joining by direct bonding two separate stacks, one comprising the exciting light source, and the other comprising the GeSn-based active layer.

By active layer based on germanium-tin (GeSn), what is meant is a layer made from a GeSn crystalline semiconductor compound comprising at least germanium and tin, and suitable for absorbing incident light radiation of a first central wavelength $\lambda_1$ emitted by the exciting light source, and for emitting in response light radiation at a second central wavelength $\lambda_2$ longer than $\lambda_1$. The germanium-tin alloy may be a binary alloy $Ge_{1-x}Sn_x$, a ternary alloy ($Si_yGe_{1-x-y}Sn_x$ for example) or even a quaternary or higher alloy. The atomic proportion of tin contained in the alloy is denoted $x_{Sn}$. The active layer based on germanium-tin is preferably made from an alloy that is uniform in terms of atomic proportion of the elements forming the alloy, and in terms of the values of any doping.

By direct bonding, sometimes also called molecular bonding, what is meant is the bonding of two surfaces of different or identical materials to each other, not by addition of a specific adhesive layer (layer of adhesive, of glue, etc.) but by way of the attractive forces of atomic or molecular interaction between the surfaces to be bonded—Van der Waals forces, hydrogen bonds, or even covalent bonds for example. The direct bonding of the stacks may be temperature-assisted (via an additional annealing phase) and/or pressure-assisted. The structure formed from the two stacks then has a bonding energy that, to a first approximation, may be written: $E_c \sim E_s \times S$, where $E_s$ is the bonding energy per unit area of the material of the surfaces to be bonded (it is assumed here that the surfaces to be bonded have substantially equal surface energies) and S is the area of the bonded surfaces. The bonding energy per unit area may be measured using the blade-insertion technique called the 'Maszara blade method': during the insertion of the blade, the debonding distance is measured, said distance being proportional to the bonding energy per unit area.

The germanium-tin (GeSn) is intended to have a direct electronic-band structure, i.e. such that the energy minimum of the L valley (or indirect valley) is higher than or substantially equal to the energy minimum of the Γ valley (or direct valley) of the conduction band, or in other words such that: $\Delta E = E_{min,L} - E_{min,\Gamma} \geq 0$. By substantially equal, what is meant here is that this energy difference $\Delta E$ is of the order of magnitude or lower than kT, where k is Boltzmann's constant and T the temperature of the material. The energy difference $\Delta E$ depends on the atomic proportion of tin $x_{Sn}$, which is notably dependent on the mechanical-strain state of the active layer. Thus, the minimum atomic proportion of tin $x_{Sn}$ required to make the electronic-band structure direct decreases as the tensile mechanical strain applied to the active layer increases (cf. Wirths et al. 2014 cited above). The GeSn-based active layer is tensilely strained in the plane of the layer when its lattice parameter has an effective value higher than its so-called natural value when the GeSn compound is relaxed, i.e. unstrained. In the context of the invention, the GeSn-based active layer may be relaxed (or quasi-relaxed), or even have a tensile strain. It has a sufficient atomic proportion of tin $x_{Sn}$ for its electronic-band structure to be direct.

The exciting light source may be a vertical-cavity-surface-emitting-laser (VCSEL) source but may also be a light-emitting diode. The acronym VCSEL will be used in the rest of the description. The exciting light source is based on semiconductor compounds, and for example based on III-V compounds, which are alloys containing at least one element of column III and at least one element of column V of the periodic table. The semiconductor compounds of the exciting light source may, for example, be InP and GaAs. By "based on" or "-based" what is meant is that the layer or structure mainly contains the one or more semiconductor compounds in question, i.e. at least 50% of its volume is formed or contains the semiconductor compounds in question.

FIGS. 1A to 1D are schematic and partial cross-sectional views of an optoelectronic device 1 for emitting infrared light in various steps of a fabricating process according to one embodiment. In this example, the optoelectronic device 1 comprises an active layer 23 based on germanium-tin (GeSn) suitable for emitting incoherent light radiation in the middlewave infrared, in response to the absorption of incident light radiation emitted by the exciting light source 11, here a VCSEL source. In addition, the crystalline compound based on germanium-tin (GeSn) of the active layer 23 is here quasi-relaxed.

Here, and for the rest of the description, a direct three-dimensional coordinate system (X, Y, Z) is defined, in which the X- and Y-axes form a plane parallel to the plane of a carrier substrate 12 on which the VCSEL source rests, and in which the Z-axis is oriented parallel to the thickness of the layers. In the rest of the description, the terms "vertical" and "vertically" will be understood to be relative to an orientation substantially parallel to the Z-axis. Moreover, the terms "lower" and "upper" will be understood to be relative to positions that are nearer to and further from the carrier layer in the +Z direction.

Figure 1A:
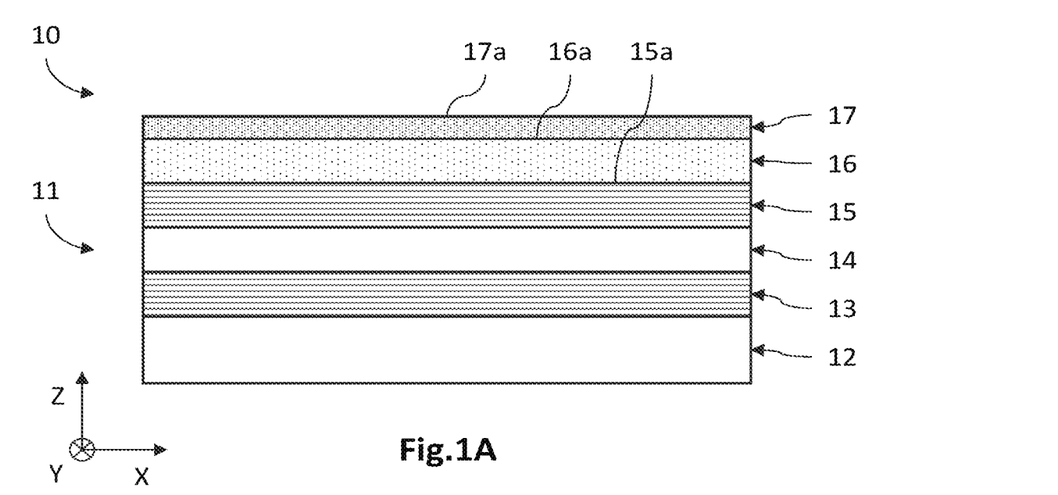
FIGS. 1A to 1D are schematic and partial cross-sectional views of structures obtained in various steps of a process for fabricating an optoelectronic device for emitting infrared light according to one embodiment.

With reference to FIG. 1A, a first stack 10 formed from at least one exciting VCSEL source 11, coated with a first binding layer 16, then a first bonding sublayer 17 defining a planar contact face 17a, is produced.

The light source 11 is suitable for emitting exciting light radiation at a first central wavelength $\lambda_1$, i.e. the emission spectrum of the light source 11 has an intensity peak centred on the wavelength $\lambda_1$, which is shorter than the emission wavelength $\lambda_2$ of the optoelectronic device 1. In this example, it is a question of a VCSEL source 11 based on III-V semiconductor compounds and the wavelength $\lambda_1$ of which is located in the visible or near infrared.

In this example, the first stack 10 comprises a carrier substrate 12 comprising an electrical circuit allowing the VCSEL source 11 to be controlled. It may to this end comprise active electronic components (transistors, capacitors, resistors etc.) connected to the VCSEL source 11 by electrical interconnects (not shown). As a variant, the carrier substrate 12 may not comprise the electrical control circuit, but may comprise electrical interconnects suitable for allowing the VCSEL source 11 to be biased electrically by an added control chip (not shown) to which the carrier substrate 12 would be connected.

The exciting VCSEL source 11 comprises a Fabry-Perot resonant cavity bounded by two reflectors, here two Bragg mirrors 13, 15, and a gain medium 14 located in the resonant cavity. It is suitable for generating light radiation of central wavelength $\lambda_1$, the latter being defined to a first approximation by the dimension of the resonant cavity and by the refractive index of the semiconductor compounds that form it. By way of example, the wavelength $\lambda_1$ may be located in the visible or in the near infrared, and may for example be equal to about 980 nm, or even to about 1300 nm. The Bragg mirrors 13,15 are formed from an alternation of quarter-wave semiconductor layers respectively having a high refractive index and a low refractive index. The quarter-wave semiconductor layers may be produced, purely by way of illustration, from the semiconductor compounds GaAs and AlAs, and the alloys thereof. Thus, the quarter wave semiconductor layers may be made from GaAs and AlGaAs. The refractive index of AlAs is 2.9 in the domain of the near infrared and that of GaAs is 3.5. The semiconductor compound $Al_xGa_{1-x}As$ thus has a refractive index comprised between 2.9 and 3.5 depending on the aluminium content x. The number of quarter-wave semiconductor layers is sufficient to obtain Bragg mirrors 13, 15 of high reflectivity at the wavelength $\lambda_1$, for example of reflectivity of the order of 99.9%. This reflectivity is much higher than in the case of a ridge laser source, insofar as, in a VCSEL source, the gain of the gain medium is low since the light radiation passes through it perpendicularly. In this example, the VCSEL source 11 comprises a lower Bragg mirror 13 made from GaAs/AlGaAs and resting on the carrier substrate 12; a gain medium 14 formed from a plurality of quantum wells, here made from InGaAs; and an upper Bragg mirror 15 made from GaAs/AlGaAs. In addition, the lower Bragg mirror 13 may be doped a first conductivity type, for example n-type, and the upper Bragg mirror 15 may be doped a second conductivity type opposite to the first type, here p-type.

The first stack 10 comprises a first binding layer 16, that continuously coats the upper face 15a of the upper Bragg mirror 15 of the VCSEL source, and that binds the VCSEL source 11 and the first bonding sublayer 17. It is made from a material that is transparent to the exciting light radiation, i.e. a material such that the coefficient of transmission of the exciting radiation associated with the first binding layer 16 is higher than or equal to 50%, and preferably more. The transparent material may be a dielectric, and be a material based on silicon, such as, for example, a silicon oxide ($SiO_2$ for example) or silicon nitride ($Si_3N_4$ for example), or even a silicon oxynitride, or indeed intrinsic (unintentionally doped) amorphous silicon. It may also be an aluminium oxide ($Al_2O_3$ for example) or a hafnium oxide ($HfO_2$ for example). The average thickness of the binding layer 16 may be comprised between a few nanometres and a few microns, and preferably is comprised between 50 nm and 1 µm. The binding layer 16 may or may not have a constant thickness in the plane of the layer, depending on whether it is structured thicknesswise or not.

The first stack 10 also comprises a first bonding sublayer 17, which continuously coats the upper face 16a of the binding layer 16. It is intended to be joined by direct bonding to the second bonding sublayer 25 of the second stack 20. It is made from a metal of interest chosen from gold (Au), copper (Cu) and titanium (Ti). Such metals have a bonding energy per unit area $E_s$ higher than or equal to 0.5 J/m² at a temperature $T_c$ called the assembly temperature, i.e. a temperature substantially comprised between the ambient temperature $T_{amb}$ and the temperature $T_{epi}$ of epitaxy of the GeSn-based active layer 23. The average thickness of the first bonding sublayer 17 may be comprised between a few nanometres and a few tons of nanometres, for example comprised between 2 nm and 20 nm, and is preferably comprised between 5 nm and 10 nm. The bonding sublayer 17 may or may not have a constant thickness in the plane of the layer, depending on whether it is structured thicknesswise or not. According to one embodiment, it has a constant thickness in the XY-plane of the layer. According to one advantageous variant, as described in detail below, it is periodically structured thicknesswise in one or two dimensions in the XY-plane of the layer. It has an upper face called the contact face 17a that is substantially planar and intended to be placed in contact with the planar contact face 25a of the second stack 20.

Figure 1B:
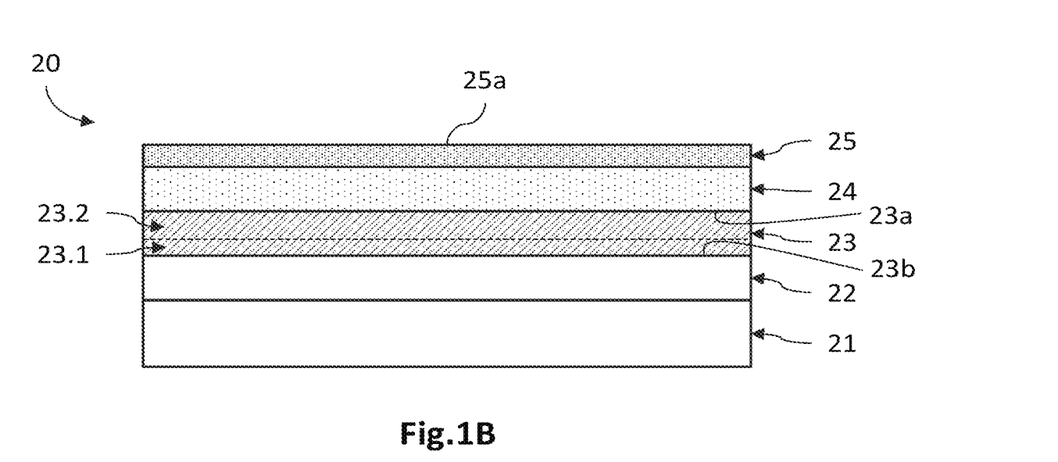

With reference to FIG. 1B, a second stack 20 is produced, this stack being formed from at least the GeSn-based active layer 23, coated with a second binding layer 24, then with a second bonding sublayer 25 defining the planar contact face 25a. The active layer 23 is here formed from a binary germanium-tin alloy $Ge_{1-x}Sn$ produced by epitaxial growth on a nucleation layer 22 placed on a growth substrate 21.

The growth substrate 21 may be made from a semiconductor, electrically conductive or dielectric material. This material may have a thickness of the order of a few tens of nanometres to a few hundred microns, for example comprised between 10 nm and 750 µm, or even comprised between 500 nm and 100 µm. It is here made from silicon, but it may more generally be chosen, inter alia, from silicon, sapphire, borosilicate, silica, glass, and quartz.

The nucleation layer 22 may be made from a single-crystal semiconductor suitable for the nucleation, or germination, of the GeSn-based active layer 23. The material of the nucleation layer 22 may be chosen from the elements or compounds of column IV of the periodic classification, such as germanium, silicon, tin and alloys formed from these elements such as GeSn, SiGeSn, and SiGe. It may also be chosen from compounds containing elements from columns III and V, such as GaP, AlP, AlAs, InGaAs, InP, and AlGaAs, or even from compounds containing elements from columns II and VI, such as ZnS, ZnSe, CdZnTe, and CdTe. It is here a question of germanium. In this example, the nucleation layer 22 is a thick layer in the sense that its thickness is larger than the critical thickness from which the mechanical strains applied to the layer plastically relax.

The GeSn-based active layer 23 is then produced by epitaxial growth on the nucleation layer 22, at an epitaxy temperature $T_{epi}$. It may be formed using chemical-vapour-deposition (CVD) techniques such as reduced-pressure chemical vapour deposition (RPCVD), metal-organic chemical vapour deposition (MOCVD), plasma-enhanced chemical vapour deposition (PECVD), hydride vapour-phase epitaxy (HVPE) or even reactive cathode sputtering. Techniques such as molecular-beam epitaxy (MBE) or liquid-phase epitaxy (LPE) may also be used. By epitaxy temperature $T_{epi}$ what is meant is the minimum temperature, applied to the growth substrate 21 in the chamber of the epitaxy reactor, that leads to the growth of the active layer 23. The epitaxy temperature $T_{epi}$ notably depends on the type of growth substrate used (thermal conductivity, thickness, etc.), and on the atomic proportion of tin $x_{Sn}$ that it is desired to incorporate into the active layer 23. Thus, the epitaxy temperature $T_{epi}$ of an active layer 23 of GeSn having an atomic proportion of tin $x_{Sn}$ equal to about 6%, 8%, 10%, 13% and 16% may be equal to 349° C., 337° C., 325° C., 313° C. and 301° C., respectively (here for a nucleation layer of 2.5 µm of germanium grown epitaxially on a silicon substrate). It may comprise an n-doped zone and a p-doped zone, between which an active zone comprising one or more quantum wells is placed.

In this example, the active layer 23 is a thick layer in the sense that its thickness is larger than its critical thickness of plastic relaxation of the mechanical strains, so that it has a compressively strained first zone 23.1 located in contact with the germanium nucleation layer 22, which may contain structural defects of the dislocation type, surmounted by a quasi-relaxed second zone 23.2 containing substantially no structural defects. Specifically, in this second zone 23.2, the effective lattice parameter of the active layer 23 is substantially equal to its value in the natural state. Hence the mechanical strains in the active layer 23 relax satisfactorily through its thickness. The large thickness of the active layer 23 thus leads to a decrease in the density of structural defects such as the dislocations due to the lattice mismatch. Moreover, the quasi-relaxed germanium-tin (GeSn) active layer 23 advantageously has an atomic proportion of tin $x_{Sn}$ allowing the electronic-band structure to be made substantially direct, and for example greater than or equal to 10%. Lastly, the active layer 23 here has a constant thickness, and comprises two substantially planar faces, a first face 23b making contact with the nucleation layer 22, and a second face 23a coated with a second binding layer 24.

The second stack 20 comprises a second binding layer 24, which continuously coats the second face 23a of the GeSn-based active layer 23, and binds the latter to the second bonding sublayer 25. It is made from a preferably dielectric material that is transparent to the exciting light radiation and to the light radiation emitted by the active layer 23, and that advantageously is identical to the material of the first binding layer 16. The average thickness of the binding layer 24 may be comprised between a few nanometres and a few microns, and preferably comprised between 50 nm and 1 µm. The binding layer 24 may or may not have a constant thickness in the plane of the layer, depending on whether it is structured thicknesswise or not.

The second stack 20 also comprises a second bonding sublayer 25, which continuously coats the binding layer 24. It is intended to be joined by direct bonding to the first bonding sublayer 17 of the first stack 10. It is made from the same metal of interest as the first bonding sublayer 17, i.e. it is chosen from gold, copper and titanium. The average thickness of the bonding sublayer 25 may be comprised between a few nanometres and a few tens of nanometres, for example is comprised between 2 nm and 20 nm, and preferably is comprised between 5 nm and 10 nm. The bonding sublayer 25 may or may not have a constant thickness in the plane of the layer, depending on whether it is structured thicknesswise or not. According to one embodiment, it may thus have a constant thickness in the XY-plane of the layer. According to one advantageous variant, as described in detail below, it is periodically structured thicknesswise in one or two dimensions in the XY-plane of the layer. It has a substantially planar face called the contact face 25a, intended to be placed in contact with the corresponding contact face 17a of the first stack 10.

The fabricating process also comprises a step of determining an assembly temperature $T_c$ at which the two stacks 10, 20 are subsequently joined, this assembly temperature $T_c$ being such that the direct bonding energy per unit area $E_s$ of said metal of interest (gold, copper or titanium) is higher than or equal to 0.5 J/m². The assembly temperature $T_c$ is substantially comprised between the ambient temperature $T_{amb}$ and the temperature $T_{epi}$ of epitaxy of the active layer 23. By substantially comprised, what is meant is that the limits are comprised, to within 10% and preferably to within 5%. The assembly temperature $T_c$ is the temperature to which the structure formed from the two stacks 10, 20 then placed in contact with each other via the contact faces 17a, 25a of the two bonding sublayers 17, 25 is exposed. This thermal exposure to the assembly temperature $T_c$ may be simultaneous or consecutive to the two stacks 10, 20 being placed in contact. When it is consecutive to the two stacks 10, 20 being placed in contact, it is then a question of a consolidating anneal at an anneal temperature $T_r$ allowing the bonding energy per unit area of said metal of interest to be increased.

In other words, the subsequent step of joining the two stacks 10, 20 by direct bonding may be carried out in either one of the following ways:

Placing the two stacks 10, 20 in contact at the assembly temperature $T_c$ alone, the latter here being equal to the ambient temperature $T_{amb}$, without consolidating anneal. The ambient temperature $T_{amb}$ is comprised, for example, between about 10° C. and 30° C. It is then a question of direct bonding at ambient temperature.

Placing the two stacks 10, 20 in contact at the assembly temperature $T_c$ alone, the latter here being higher than the ambient temperature $T_{amb}$. It is then a question of temperature-assisted direct bonding, without a specific consolidating-anneal phase.

Placing the two stacks 10, 20 in contact at a first temperature, for example the ambient temperature $T_{amb}$, followed by a consolidating anneal at an anneal temperature $T_r$ higher than the ambient temperature $T_{amb}$ and equal to the assembly temperature $T_c$. It is then a question of temperature-assisted direct bonding, with a specific consolidating-anneal phase.

Thus, the joining step comprises a phase in which the stacks 10, 20 are placed in contact, optionally followed by a phase in which a consolidating anneal is carried out. The assembly temperature $T_c$ such that the direct bonding energy per unit area $E_G$ of said metal of interest is higher than or equal to 0.5 J/m² therefore corresponds to the ambient temperature $T_{amb}$ or to the anneal temperature $T_r$, which is therefore higher than the ambient temperature $T_{amb}$, and lower than or substantially equal to the temperature $T_{epi}$ of epitaxy of the active layer 23. It is said to be substantially equal to the epitaxy temperature $T_{epi}$ in the sense that it is equal to the temperature $T_{epi}$ to within 10%, and preferably to within 5%. Preferably, the anneal temperature is lower than or equal to 300° C. The direct bonding of the stacks 10, 20 may therefore be temperature-assisted, and may furthermore be pressure-assisted. In this case, the stacks 10, 20 are joined by applying a pressure to the stacks then placed in contact.

Specifically, the inventors have observed that the two stacks 10, 20 are satisfactorily joined to each other when the bonding surface energy $E_s$ of the metal of interest is higher than or equal to 0.5 J/m², and, preferably, higher than or equal to 1 J/m². Now, it appears that the metals gold, copper and titanium have a direct bonding energy per unit area that may be higher than or equal to 0.5 J/m², and preferably higher than or equal to 1 J/m², when they are subjected to an assembly temperature $T_c$ substantially comprised between the ambient temperature $T_{amb}$ and the epitaxy temperature $T_{epi}$ of the active layer 23. It is therefore not necessary, to obtain the sought-after values of bonding energy per unit area, to carry out a thermal anneal at a temperature above, to within 10%, the epitaxy temperature $T_{epi}$ of the active layer 23, this making it possible to avoid the risk of degradation of the crystal quality of the active layer 23 via potential demixing of at least some of the tin contained in the germanium-tin. Specifically, gold has a direct bonding energy per unit area $E_s$ equal to about 4 J/m² at ambient temperature $T_{amb}$, which may reach a value of about 7 J/m² when it is subjected to an anneal temperature $T_r$ of 300° C. Copper has a direct bonding energy per unit area $E_s$ of about 1.5 J/m² at ambient temperature $T_{amb}$, which may increase up to 4 J/m² or even more when it is subjected to an anneal temperature $T_r$ ranging up to 300° C. Titanium has a direct bonding energy per unit area $E_s$ equal to about 0.1 J/m² at ambient temperature $T_{amb}$, which reaches 1 J/m² when it is subjected to an anneal temperature $T_r$ equal to 100° C., and up to about 3 J/m² when it is subjected to an anneal temperature $T_r$ of 300° C.

Figure 1C:
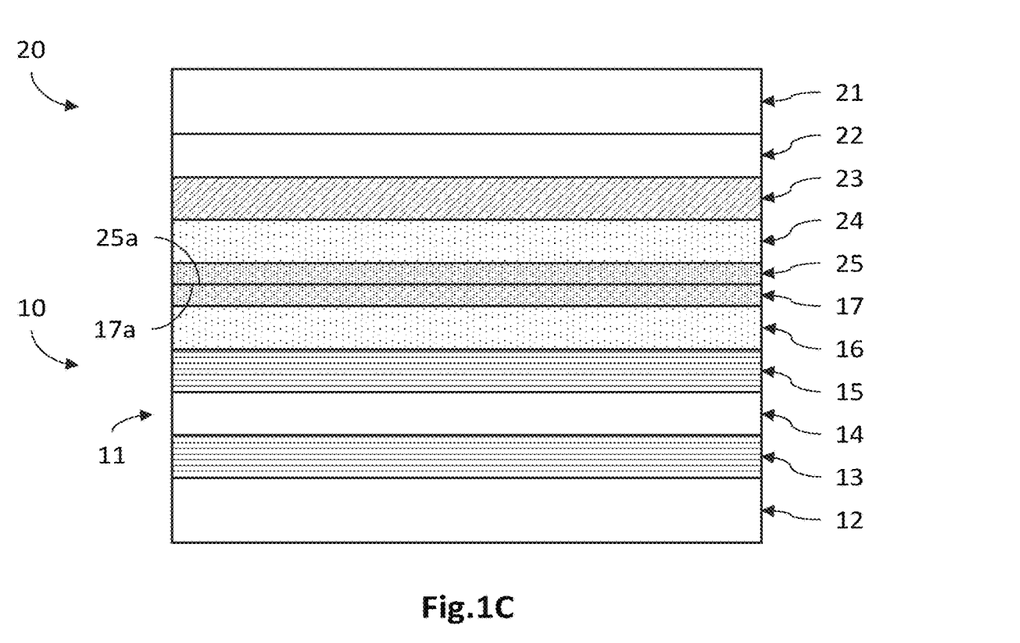

With reference to FIG. 1C, the step of joining by direct bonding the two stacks 10, 20 at the assembly temperature $T_c$ determined beforehand is carried out. Preferably, the contact faces 17a, 25a have a roughness lower than or equal to 5 nm RMS in the context of direct bonding that is not pressure-assisted, or even a roughness lower than or equal to 30 nm RMS in the context of pressure-assisted direct bonding. The stacks 10, 20 are therefore placed in contact with each other via the contact faces 17a, 25a of the bonding sublayers 17, 25, the assembly temperature $T_c$ being equal to the ambient temperature $T_{amb}$ or to said anneal temperature $T_r$, depending on the metal of interest chosen. Thus, the two stacks 10, 20 are joined to each other, without addition of specific adhesive material (such as an adhesive, glue, etc.)

but by way of the attractive forces of atomic or molecular interaction between the metal of interest of the two bonding sublayers 17, 25.

By way of example, the active layer 23 made from $Ge_{1-x}Sn_x$ is produced by RPCVD epitaxial growth with an atomic proportion of tin $x_{Sn}$ equal to about 13% so as to obtain a quasi-relaxed active layer 23 that nonetheless has a direct electronic-band structure. The epitaxy temperature $T_{epi}$ is here equal to about 313° C. In the case where the metal of interest is gold or copper, the stacks 10, 20 are joined by direct bonding at an assembly temperature $T_c$ equal to the ambient temperature $T_{amb}$, for example about 20° C., or advantageously at an anneal temperature $T_r$ higher than the ambient temperature $T_{amb}$ and lower than or equal to the epitaxy temperature $T_{epi}$ to within 10%, i.e. lower than or equal to 344° C. and preferably lower than or equal to 329° C. In the case where the metal of interest is titanium, the stacks are joined by direct bonding at an assembly temperature $T_c$ equal to the anneal temperature $T_r$, which is higher than the ambient temperature $T_{amb}$, and lower than or equal to the epitaxy temperature $T_{epi}$ to within 10%, i.e. here lower than or equal to 344° C., and preferably lower than or equal to 329° C.

Figure 1D:
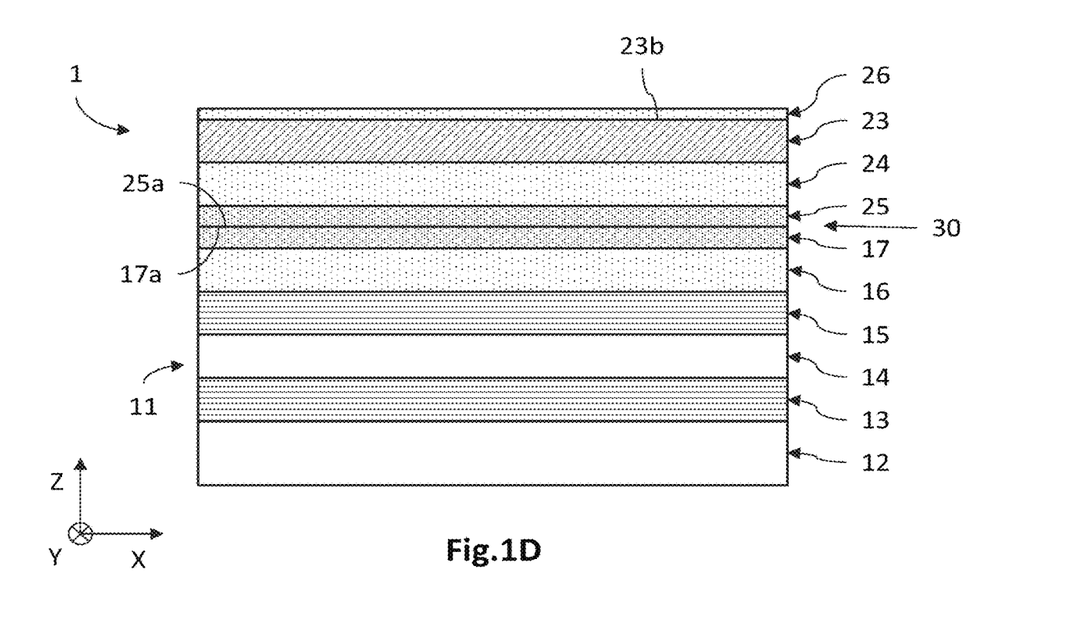

The fabricating process advantageously comprises a step of removing the nucleation layer 22 and the growth substrate 21, for example by grinding, so as to free a first face of the GeSn-based active layer 23, which is then the emitting face 23b of the optoelectronic device 1, in particular when the materials of the growth substrate 21 and of the nucleation layer 22 have a nonzero coefficient of absorption of the infrared light radiation emitted by the active layer 23. Moreover, in the case where the active layer 23 is a thick layer, it is advantageous to also remove some of the thickness of the active layer 23, in particular the first zone 23.1 initially in contact with the nucleation layer 22, in so far as said zone contains structural defects associated with the plastic relaxation of the mechanical strains. A thin passivating layer 26, made from a dielectric that is transparent to the infrared light radiation, may then be deposited so as to cover the active layer 23.

Thus, the fabricating process allows an optoelectronic device 1 for emitting infrared light comprising an exciting light source 1 and a GeSn-based active layer 23 that are joined to each other via direct bonding of two stacks at low temperature to be obtained. Via the choice of the bonding metal of interest from among gold, copper and titanium, a joint of high mechanical strength is obtained between the two stacks 10, 20 via direct bonding carried out at low temperature (ambient temperature or anneal temperature below or substantially equal to the temperature of epitaxy of the active layer 23), this making it possible to avoid the risk of degradation of the crystal quality of the GeSn-based active layer 23 via potential partial demixing of the tin contained in the layer.

In addition, the fabricating process permits the GeSn-based active layer 23 to be produced with a high crystal quality and with a direct electronic-band structure, irrespectively of whether the active layer 23 is quasi-relaxed and contains a high atomic proportion of tin $x_{Sn}$ (for example of the order of 12%), or a tensile mechanical strain is applied to it in the plane of the layer and it contains a lower atomic proportion of tin $x_{Sn}$ (for example of the order of 8%). It may also be a question of a pseudomorphic active layer 23, i.e. here of a compressively strained layer. It is then possible to produce a thick active layer 23, for example on a virtual-substrate formed from a silicon growth substrate 21 and from a thick germanium nucleation layer, as notably described in the publication by Wirths 2015 cited above, or using a strain-engineering technique employing an intermediate layer based on $Ge_{1-y}Sn_y$ having an atomic proportion of tin $y_{Sn}$ higher than that of the active layer 23, as notably described in the publication by Wirths et al. entitled *Tensely strained GeSn alloy as optical gain media*, Appl. Phys. Lett. 103, 192110 (2013).

The optoelectronic device 1 thus comprises a metal intermediate layer 30 formed by the two bonding sublayers 17, 25 joined to each other. However, it would appear that this metal intermediate layer 30, when it forms a planar layer of constant thickness, has a relatively low coefficient of transmission T with respect to the exciting light radiation. Thus, by way of example, for exciting light radiation of wavelength $\lambda_1$ equal to 980 nm, the coefficient of transmission T is of the order of 20% for a metal intermediate layer 30 of a constant thickness of about 20 nm made from gold or made from titanium.

Thus, the fabricating process advantageously comprises, in the step of producing the first and/or second stacks 10, 20, a phase of structuring the first and/or second bonding sublayers 17, 25 thicknesswise, so that the metal intermediate layer 30 thus formed is periodically structured thicknesswise in the XY-plane of the layer, i.e. it comprises a periodic grating 32 of one- or two-dimensional patterns 34. The patterns 34 (dotted lines) are formed by a local variation in the thickness of the metal intermediate layer 30.

Figure 2A:
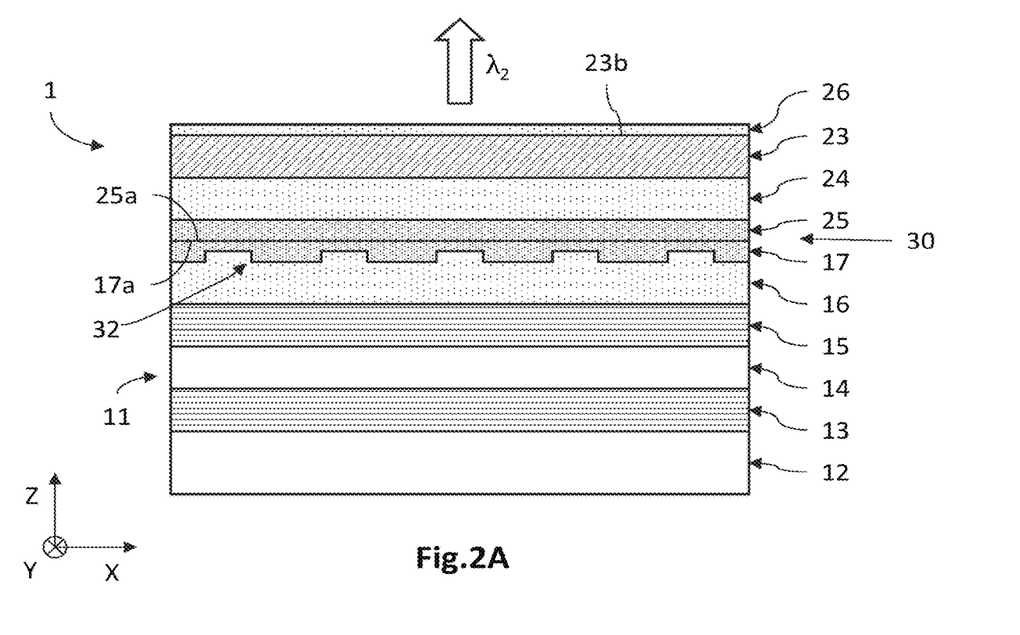
FIGS. 2A and 2B are schematic and partial cross-sectional views of an optoelectronic device obtained using a fabricating process according to another embodiment, FIG. 2B illustrating one portion of the optoelectronic device illustrated in FIG. 2A.
Figure 2B:
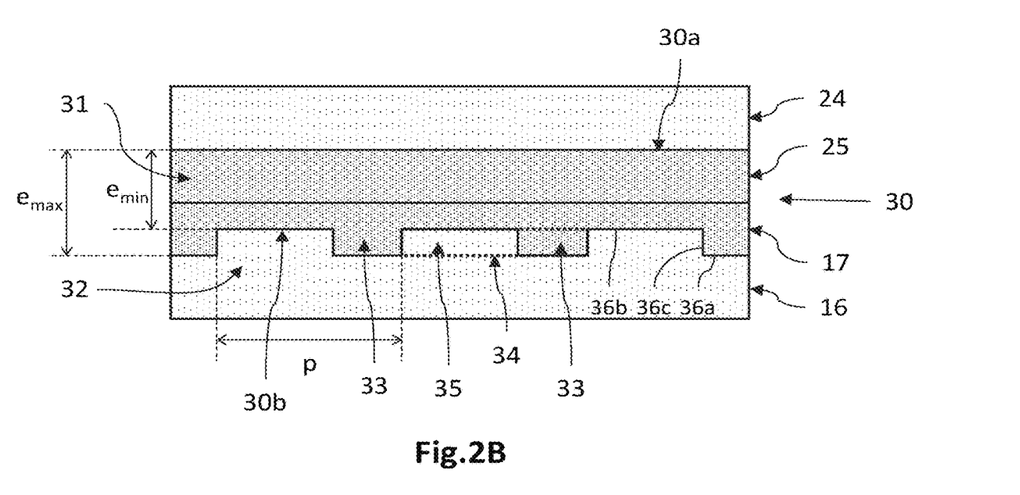

FIG. 2A is a schematic and partial cross-sectional view of an optoelectronic device 1 for emitting infrared light according to another embodiment, which mainly differs from that illustrated in FIG. 1D in that the metal intermediate layer 30 comprises a periodic grating 32. FIG. 2B is a detail view of one portion of the metal intermediate layer 30 interposed between the two binding layers 16, 24.

The periodic structuring of the metal intermediate layer 30 thicknesswise results in a periodic repetition, in one or two dimensions in the XY-plane of the layer, of identical patterns 34, causing the thickness of the metal intermediate layer 30 to vary locally. Each pattern 34 is defined as being a pad 33 of the metal of interest, integrally formed with a continuous portion 31 of constant non-zero thickness $e_{min}$ of the metal intermediate layer 30, each pad 33 being separated from the adjacent pads 33 by a recess 35 filled with the transparent material of the binding layer 16. The pads 33 therefore form protrusions with respect to the continuous portion 31 of constant thickness of the metal intermediate layer 30. The metal of interest of the metal intermediate layer 30 has a refractive index different from that of the transparent material of the binding layer 16. Generally, a pad 33 may have any shape (polygonal shape, circular shape, elongate shape, etc.). The periodic grating 32 may have a periodicity in one or two dimensions: in the case of a one-dimensional periodicity, the pads 33 form separate lines or strips that lie parallel to one another; in the case of a two-dimensional periodicity, the pads 33 may form closed and concentric lines or strips. The lines or strips may extend longitudinally and optionally continuously. Moreover, the period may be equal or different in the two dimensions of periodicity of the grating 32.

The metal intermediate layer 30 has a lower face 30b that makes contact with the first binding layer 16, and an upper face 30a that makes contact with the second binding layer 24. Thus, the lower face 30b and/or the upper face 30a are structured, i.e. formed from end portions 36a where the local thickness of the metal intermediate layer 30 is maximum, and bottom portions 36b where the local thickness is minimum. The bottom portions 36b and the end portions 36a are connected together by lateral portions 36c. In this example, the lower face 30b is structured so as to form the periodic grating 32 whereas the upper face 30a is planar. As a variant, the converse may be true, or both the lower face 30b and upper face 30a may be structured. It will be noted that, in FIGS. 2A and 2B, for the sake of clarity, the structuring of the lower face 30b has been drawn using right angles though, in actual fact, the angles are locally rather rounded.

The minimum thickness $e_{min}$ and maximum thickness $e_{max}$ of the metal intermediate layer 30 are defined as being the minimum and maximum local distances between the lower and upper faces 30b, 30a, respectively. Thus, the metal intermediate layer 30 comprises a continuous portion 31 of nonzero minimum thickness $e_{min}$, and the periodic grating 32 is defined by, on the one hand, the period p of periodic arrangement of the pads 33 in the XY-plane and, on the other hand, a fill factor 4 equal to the ratio between the volume of the metal of interest in one pattern 34 and the total volume of the pattern in question. The period p is preferably subwavelength, i.e. it is preferably smaller than the wavelength $\lambda_1$ of the exciting light radiation. Preferably, the period p is comprised between 0.1 µm and 1 µm when the wavelength $\lambda_1$ is equal to about 980 nm or to about 1300 nm. Moreover, the height of the pads 33, i.e. the distance along the Z-axis between a plane passing through the bottom portions 36b and a plane passing through the end portions 36a of the pads 33, is preferably comprised between 1 nm and 10 nm.

In this example, the periodic grating 32 of the metal intermediate layer 30 is obtained in the following way. The first binding layer 16 is structured thicknesswise so that its upper face 16a has periodically distributed recesses the depth of which is substantially equal to the desired height of the pads 33 of the periodic grating 32. Here, the recesses have a depth equal to about 5 nm. They may be obtained using a conventional lithography or nano-printing technique, or any other equivalent technique followed by etching and removal of the resist. On the upper face 16a thus structured, the first binding sublayer 17 is deposited so as to cover the upper face 16a and to fill the recesses. The segments of bonding metal located in the recesses thus form the pads 33 of the periodic grating 32. Chemical-mechanical polishing (CMP) may be carried out so as to make the contact face 17a of the bonding sublayer 17 planar. Thus, the bonding sublayer 17 comprises a continuous portion of constant thickness, for example of a thickness of about 10 nm, with respect to which the pads 33 of the periodic grating 32 protrude in the −Z-direction. In this example, the second bonding sublayer 25 is not structured thicknesswise: it thus has a constant thickness, for example equal to about 10 nm. Thus, after the two stacks 10, 20 have been joined by direct bonding via the contact faces 17a, 25a of the bonding sublayers 17, 25, a metal intermediate layer 30 formed from a continuous portion 31 of constant thickness, here equal to about 20 nm, with respect to which the pads 33 of the periodic grating 32 protrude at the interface with the first binding layer 16, is obtained.

It surprisingly turns out that for certain values of the geometric parameters p and ϕ of the periodic grating 32, the coefficient of transmission T of the metal intermediate layer 30 comprising this periodic grating 32 with optimized dimensions has a value substantially higher than is the case for the same metal intermediate layer 30 not comprising such a periodic grating 32, i.e. for a planar metal intermediate layer 30 of a constant thickness equal to the minimum thickness $e_{min}$ of the metal intermediate layer 30 having the periodic grating 32.

Figure 3A:
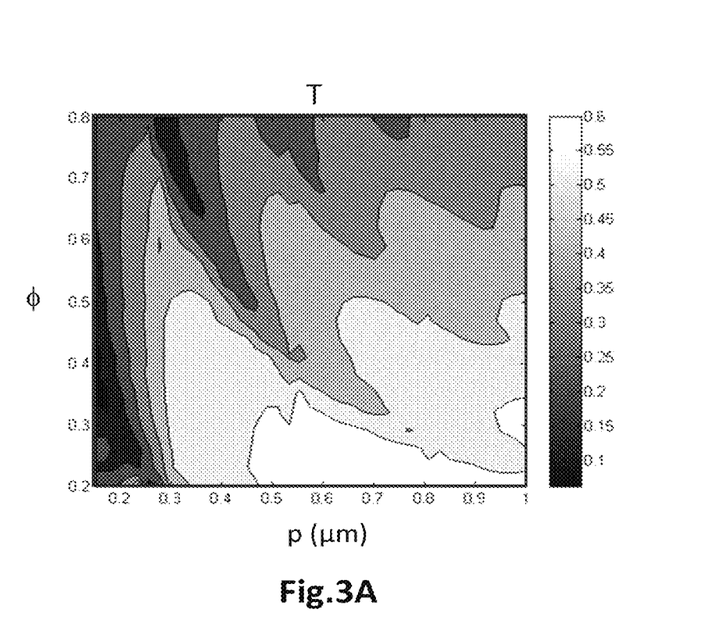
FIGS. 3A-3B and 4A-4B illustrate examples of variation in the coefficient of transmission T associated with the metal intermediate layer of the optoelectronic device illustrated in FIG. 2A, as a function of geometric parameters of the periodic grating that it comprises.
Figure 3B:
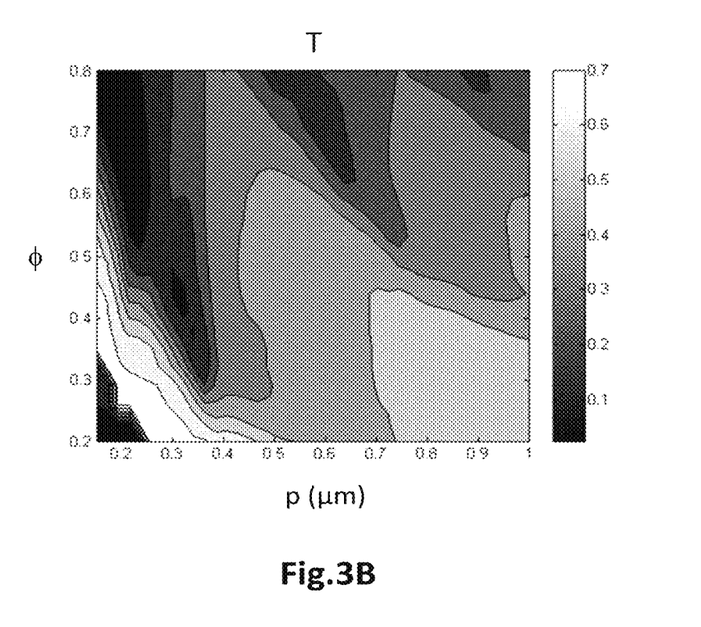

In this respect, FIGS. 3A and 3B illustrate two examples of variation of the coefficient of transmission T of the metal intermediate layer 30 interposed between two binding layers 16, 24, for various values of the period p and of the fill factor ϕ. In these examples, the metal intermediate layer 30 is placed between two binding layers 16, 24 made from intrinsic amorphous silicon.

In these two examples, the metal intermediate layer 30 is made from gold and has a minimum thickness $e_{min}$ equal to about 20 nm. It is thus formed from a continuous portion 31 of constant thickness $e_{min}$ containing the second bonding sublayer 25 of constant thickness equal to 10 nm and a portion of constant thickness equal to 10 nm of the first bonding sublayer 17. It is also formed from a periodic grating 32 located at the interface with the first binding layer 16. The periodic grating 32 comprises pads 33 of a height of about 5 nm, which protrude from the continuous portion 31. Thus, the metal intermediate layer 30 has a minimum thickness $e_{min}$ equal to 20 nm and a maximum thickness $e_{max}$ equal to 25 nm. The periodic grating 32 here has a one-dimensional periodicity and the pads 33 form lines that run parallel to one another.

In the example of FIG. 3A, the exciting light radiation has a central wavelength $\lambda_1$ equal to 980 nm. The coefficient of transmission T would appear to have maximum values when the period p is comprised between about 0.4 µm and 1.0 µm, and the fill factor ϕ is comprised between about 0.2 and 0.4. Thus, the coefficient of transmission has an optimal value of about 69% when the period p is equal to 0.85 µm to within 10%, and the fill factor is equal to 0.20 to within 10%.

In the example of FIG. 3B, the exciting light radiation has a central wavelength $\lambda_1$ equal to 1300 nm. The coefficient of transmission T would appear to have maximum values when the period p ranges from about 0.1 µm to 0.3 µm provided that the fill factor ranges from about 0.2 to 0.4. Thus, the coefficient of transmission has an optimal value of about 75% when the period p is equal to 0.25 µm to within 10%, and the fill factor is equal to 0.3 to within 10%.

It should thus be apparent that these optimal values of the coefficient of transmission T are much higher than the value of 20% corresponding to a metal intermediate layer 30 made from gold having a constant thickness equal to about 20 nm, i.e. without periodic grating 32. Thus, by structuring the metal intermediate layer 30 so that it has a periodic grating 32 and via the step of determining the corresponding geometric parameters (period p, dimensions of the pads 33: here fill factor ϕ), it is possible to greatly improve the coefficient of transmission of the exciting light radiation through the metal intermediate layer 30, and thus to improve the optical performance of the optoelectronic device 1. The fill factor is one of the possible geometric parameters allowing the periodic grating 32 to be defined. Other parameters may be used, such as for example the aspect ratio of the pads 33 and the aspect ratio of the adjacent recesses, inter alia.

Figure 4A:
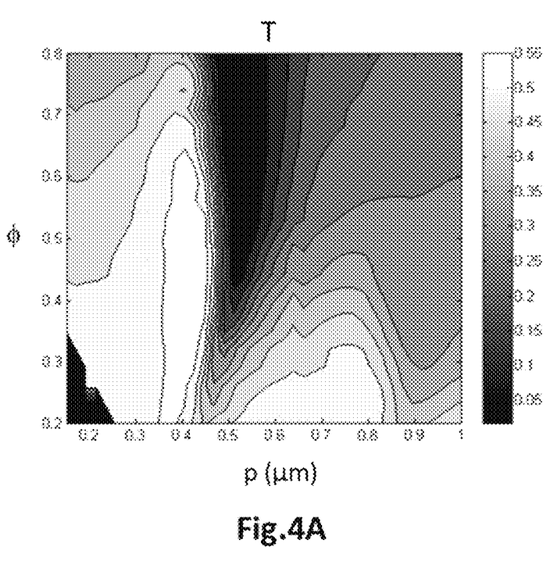
Figure 4B:
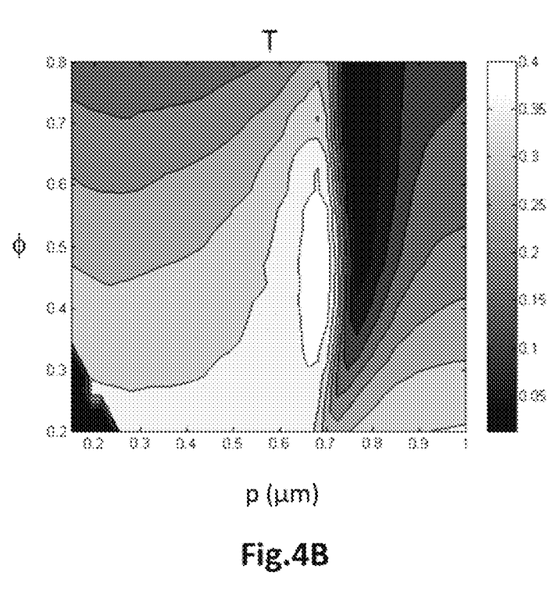

FIGS. 4A and 4B illustrate two examples of variation of the coefficient of transmission T of the metal intermediate layer 30 interposed between two binding layers 16, 24, for various values of the period p and of the fill factor $. In these examples, the metal intermediate layer 30 is placed between two binding layers 16, 24 made from silicon oxide, here $SiO_2$.

In the example of FIG. 4A, the exciting light radiation has a central wavelength $\lambda_1$ equal to 980 nm. The coefficient of transmission T would appear to have maximum values when the period p is equal to 0.4 µm to within 10%, and the fill factor is comprised between about 0.2 and 0.7. Thus, the coefficient of transmission has an optimal value of about 59% when the period p is equal to 0.4 μm to within 5%, and the fill factor is equal to 0.45 to within 10%.

In the example of FIG. 4B, the exciting light radiation has a central wavelength $\lambda_1$ equal to 1300 nm. The coefficient of transmission T would appear to have maximum values when the period p is equal to 0.65 μm to within 5%, and the fill factor $\phi$ is comprised between about 0.25 and 0.65. Thus, the coefficient of transmission has an optimal value of about 43% when the period p is equal to 0.45 μm to within 5%, and the fill factor is equal to 0.45 to within 10%.

It would appear that the variation in the coefficient of transmission of the exciting light radiation through the metal intermediate layer 30 also depends on the optical properties of the material of the binding layers 16, 24, and notably on its refractive index. Specifically, the coefficient of transmission T, for a metal intermediate layer 30 and periodic grating 32 thereof of given dimensions, exhibits a different variation depending on whether the material of the binding layers 16, 24 is amorphous silicon (FIGS. 3A and 3B) or is a silicon oxide (FIGS. 4A and 4B). In any case, structuring the metal intermediate layer 30 so as to form a periodic grating 32 having predetermined geometric parameters allows the coefficient of transmission T of the exciting light radiation through the metal intermediate layer 30 to be greatly improved, and thus the optical performance of the optoelectronic device 1 to be improved.

The optoelectronic device 1 may thus comprise a VCSEL source as exciting light source 11. In this case, the metal intermediate layer 30 covers the upper mirror 15 of the VCSEL source 11 and is separated therefrom by the first binding layer 16. However, it turns out that the presence of the metal intermediate layer 30 may induce a perturbation of the optical properties of the upper mirror 15 of the VCSEL source 11 and therefore of the resonant cavity thereof.

Figure 5A:
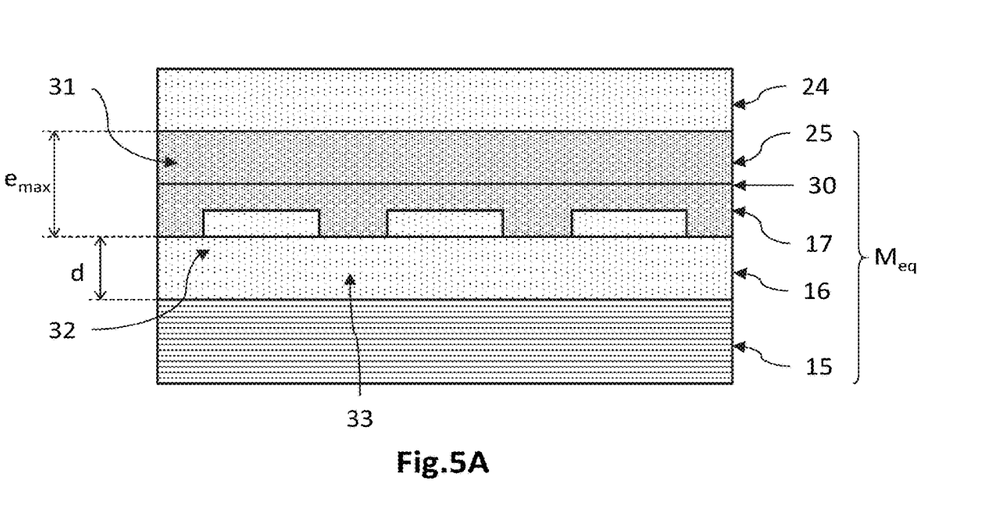
FIG. 5A is a schematic and partial cross-sectional view of one portion of the optoelectronic device illustrated in FIG. 2A, illustrating the distance d separating the metal intermediate layer from an upper mirror of a VCSEL source.

FIG. 5A is a schematic cross-sectional view of one portion of an optoelectronic device 1 according to one embodiment. Here, the metal intermediate layer 30 is placed at a distance d from the upper mirror 15 of the VCSEL source 11. The distance d separating the upper mirror 15 from the metal intermediate layer 30 is defined as being the distance along the Z-axis between the upper face 15a of the upper mirror 15 of the VCSEL source 11, and the plane passing through the end portions 36a, where appropriate, of the lower face 30b of the metal intermediate layer 30. The equivalent mirror formed from the upper mirror 15 of the VCSEL source and from the metal intermediate layer 30 (the latter having a nonzero coefficient of reflection with respect to the exciting light radiation) is moreover denoted $M_{eq}$. The mirror $M_{eq}$ participates in the definition of the optical cavity of the VCSEL source 11: thus, it is desired for it to have a high coefficient of reflection R with respect to the exciting light radiation. However, it turns out that the exciting light radiation interferes destructively in the Fabry-Perot cavity formed by the upper mirror 15 of the VCSEL source and the metal intermediate layer 30.

Figure 5B:
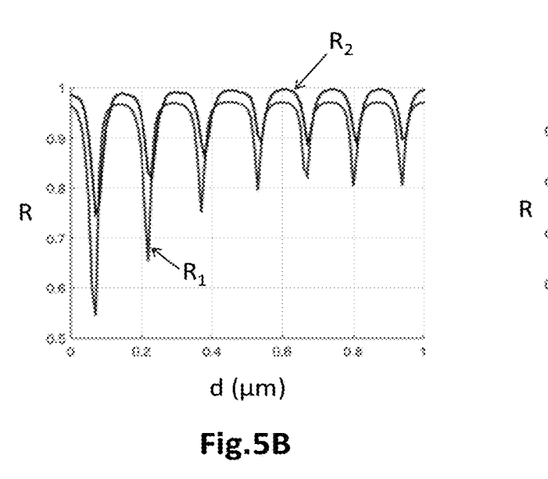
FIGS. 5B and 5C illustrate examples of variation in the coefficient of reflection R of an equivalent mirror formed by the upper mirror and the metal intermediate layer, as a function of the distance d.
Figure 5C:
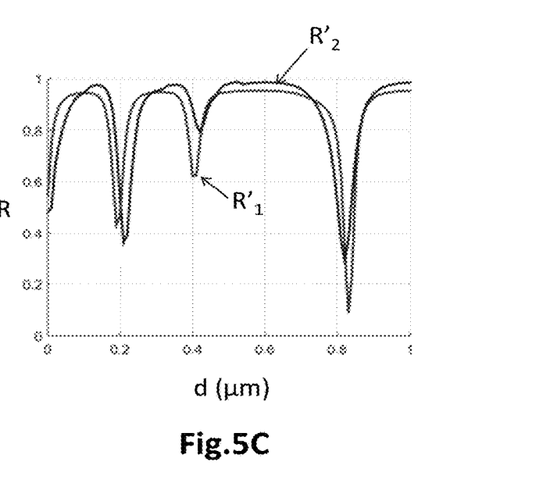

In this respect, FIGS. 5B and 5C illustrate examples of variation of the coefficient of reflection R of the equivalent mirror $M_{eq}$ with respect to exciting light radiation of central wavelength $\lambda_1$ as a function of the distance d separating the upper mirror 15 of the VCSEL source 11 from the metal intermediate layer 30. The curves $R_1$ and $R'_1$ correspond to a metal intermediate layer 30 without periodic grating 32, and that the curves $R_2$ and $R'_2$ correspond to a metal intermediate layer 30 with an optimized periodic grating 32.

It would appear that the coefficient of reflection R indeed depends on the distance d: its value thus drops periodically as the distance d varies. This periodic drop in the coefficient of reflection R may lead to a degradation of the optical properties of the equivalent mirror $M_{eq}$, and therefore of the upper mirror 15 of the VCSEL source 11, in the case where the distance d is not correctly chosen. Thus, the properties of the resonant cavity of the VCSEL source 11 are modified by poor positioning of the metal intermediate layer 30 with respect to the subjacent upper mirror 15, and the performance of the optoelectronic device 1 may be degraded. Moreover, this periodic drop in the coefficient of reflection R is observed if a metal intermediate layer 30 made from a metal of interest chosen from gold, copper and titanium is present, whether or not it comprises the periodic grating 32.

Thus, the example of FIG. 5B corresponds to an upper mirror 15 of the VCSEL source 11 formed from an alternation of a quarter-wave GaAlAs layer of 75 nm thickness and of a quarter-wave AlAs layer of 77 nm thickness, in order to obtain the transmission of exciting light radiation the central wavelength of which is equal to about 980 nm. The binding layers are made from intrinsic amorphous silicon, and the metal intermediate layer 30 is made from gold and has a minimum thickness $e_{min}$ equal to about 20 nm. Two curves $R_1$ and $R_2$ are shown and correspond to a metal intermediate layer 30 without and with an optimized periodic grating 32, respectively. The periodic grating 32 has geometric parameters (period p and fill factor $\phi$) determined to maximize the coefficient of transmission T of the exciting light radiation incident at the wavelength $\lambda_1$. Here, the period p is equal to about 700 nm and the fill factor $\phi$ is equal to about 0.25. In the case where the metal intermediate layer 30 does not comprise a periodic grating 32 (curve $R_1$), the coefficient of reflection R would appear to have minimum values varying between 55% and 80% as a function of the distance d, and a maximum value of the order of 95%. In the case where the metal intermediate layer 30 comprises the optimized periodic grating 32 (curve $R_2$), the coefficient of reflection R has minimum values varying between 75% and 90% as a function of the distance d, and a maximum value of the order of 99%. It will be clear from the above that when the metal intermediate layer 30 comprises an optimized periodic grating 32 as described above, the degradation of the optical properties of the equivalent mirror $M_{eq}$, and therefore of the optical properties of the optical cavity of the VCSEL source, is less. In addition, it is possible to determine a distance d allowing any degradation of the optical properties of the equivalent mirror $M_{eq}$, and therefore of the optical properties of the optical cavity of the VCSEL source 11, to be decreased. In this example, the distance d is preferably equal to about 500 nm so as to meet the phase condition (phase difference equal to zero modulo $2\pi$) between the wave reflected from the upper mirror 15 of the VCSEL source and the wave reflected by the metal intermediate layer 30.

Moreover, the example of FIG. 5C corresponds to an upper mirror 15 of the VCSEL source 11 formed from an alternation of a quarter-wave GaAs layer of 95 nm thickness and a quarter-wave AlAs layer of 112 nm thickness, in order to obtain the transmission of exciting light radiation the central wavelength of which is equal to about 1300 nm. The binding layers 16, 24 are made from silicon oxide, here $SiO_2$, and the metal intermediate layer 30 is made from gold and has a minimum thickness $e_{min}$ equal to about 20 nm. Two curves $R'_1$ and $R'_2$ are shown and correspond to a metal intermediate layer 30 without and with an optimized periodic grating 32, respectively. The periodic grating 32 has a period p equal to about 650 nm and the fill factor 4 is equal to about 0.5. In the case where the metal intermediate layer 30 does not comprise a periodic grating 32 (curve $R'_1$), the coefficient of reflection R would appear to have minimum values varying between 15% and 60% as a function of the distance d, and a maximum value of the order of 90%. In the case where the metal intermediate layer 30 comprises the optimized periodic grating 32 (curve R'$_2$), the coefficient of reflection R has minimum values varying between 30% and 80% as a function of the distance d, and a maximum value of the order of 99%. It will be clear from the above that, here also, when the metal intermediate layer 30 comprises an optimized periodic grating 32, the degradation of the optical properties of the equivalent mirror M$_{eq}$, and therefore of the optical properties of the optical cavity of the VCSEL source, is less. In addition, it is possible to determine a distance d allowing any degradation of the optical properties of the equivalent mirror M$_{eq}$, and therefore of the optical properties of the optical cavity of the VCSEL source, to be decreased. In this example, the distance d is preferably equal to about 600 nm so as to meet the phase condition (phase difference equal to zero modulo 2π) between the wave reflected from the upper mirror 15 of the VCSEL source and the wave reflected by the metal intermediate layer 30.

Thus, the process for fabricating the optoelectronic device 1 advantageously comprises a step of determining the distance d separating the metal intermediate layer 30 from the upper mirror 15 of the VCSEL source 11. To this end, taking account of the optical properties of the upper mirror 15 of the VCSEL source 11 (central wavelength λ$_1$), and of the optical properties of the metal intermediate layer 30 (with or without periodic grating 32), the variation in the coefficient of reflection R of such an equivalent mirror M$_{eq}$ as a function of the distance d is computed. The computation may be carried out by numerical simulation, for example by means of the software package RSoft using an RCWA or FDTD method.

Moreover, the metal intermediate layer 30 comprising the periodic grating 32 would appear to effectively reflect the light radiation emitted by the active layer 23, in so far as the wavelength λ$_2$ is longer than the wavelength λ$_1$ of the light radiation emitted by the VCSEL source, thus improving the diffractive and reflective properties of the periodic grating 32. In this respect, the optical interaction between the GeSn-based active layer 23 and the metal intermediate layer 30 may be optimized. To this end, the distance between these two layers 23, 30 is notably chosen so that the phase condition (phase difference equal to zero modulo 2π) is met between the optical wave of wavelength λ$_2$ emitted by the active layer 23 in the −Z-direction and the optical wave of wavelength λ$_2$ reflected/diffracted by the periodic grating 32 in the +Z-direction.

Particular embodiments have just been described. Various variants and modifications will appear obvious to those skilled in the art. Thus, the optoelectronic device 1 may comprise a matrix array of emitting pixels, the pixels being formed from separate segments of a GeSn-based active layer 23 arranged with separate exciting light sources and arranged in a coplanar manner.

Moreover, as mentioned above, the exciting light source 11 may be formed from a light-emitting diode or be a VCSEL laser diode. The light radiation emitted by the active layer 23 in response to the absorption of the exciting light radiation may be coherent or incoherent. In the case of coherent light radiation, the active layer 23 may have a periodic structuring of the photonic-crystal type, so as to form, within the active layer 23, a resonant optical cavity oriented in the plane of the layer 23, allowing coherent infrared light radiation to be generated. Similar structuring is notably described in the publication by Thai et al. entitled *2D hexagonal photonic crystal GeSn laser with 16% In content*, Appl. Phys. Lett. 113, 051104 (2018).

The invention claimed is:

1. A process for fabricating an optoelectronic device for emitting infrared light radiation, comprising the following steps:
   i) producing a first stack comprising:
      a. a light source of exciting light radiation,
      b. a first bonding sublayer made from a metal of interest chosen from gold, titanium and copper, having a first contact face,
      c. between which is placed a first binding layer made from a material that is transparent to the exciting light radiation;
   ii) producing a second stack comprising:
      a. a GeSn-based active layer configured to absorb the exciting light radiation and to emit in response the infrared light radiation, having an atomic proportion of tin such that it has a direct electronic-band structure, and being obtained by epitaxial growth at an epitaxy temperature,
      b. a second bonding sublayer made from said metal of interest, having a second contact face,
      c. between which is placed a second binding layer made from a material that is transparent to the exciting light radiation;
   iii) determining an assembly temperature comprised between an ambient temperature and said epitaxy temperature, to within 10%, such that a direct bonding energy per unit area of said metal of interest is higher than or equal to 0.5 J/m$^2$; and
   iv) joining, by direct bonding, at said assembly temperature, said stacks via said contact faces.

2. The fabricating process according to claim 1, comprising the following phases:
   structuring the first bonding sublayer and the second bonding sublayer thicknesswise, so that a metal intermediate layer formed by said bonding sublayers when joined to each other comprises at least one periodic grating, the metal intermediate layer having a nonzero minimum thickness;
   determining, prior to the structuring phase, geometric parameters of the periodic gating, so that, the metal intermediate layer has a coefficient of transmission of the exciting light radiation of a value higher than a preset value corresponding to an equivalent planar metal intermediate layer without periodic gating and of a constant thickness equal to said minimum thickness.

3. The fabricating process according to claim 2, wherein the periodic grating is located at the interface with the first and/or second binding layers, said contact faces being planar.

4. The fabricating process according to claim 2, wherein the metal intermediate layer comprises at least one continuous portion of a constant first thickness equal to the minimum thickness and pads arranged to protrude with respect to the continuous portion and forming the periodic grating.

5. The fabricating process according to claim 1, the exciting light source being a light-emitting diode or a vertical-cavity-surface-emitting-laser source.

6. The fabricating process according to claim 1, Wherein the exciting light source is a vertical-cavity-surface-emitting-laser source comprising a lower reflector and an upper reflector between which a gain medium is placed, the upper reflector making contact with and being covered by the first binding layer, the process comprising the following phase:

determining, prior to the phase of producing the first stack, a thickness of the first binding layer, so that an equivalent reflector formed by the upper reflector and by the metal intermediate layer, separated from each other by the first binding layer, has a coefficient of reflection of the exciting light radiation of a value higher than a preset value.

7. The fabricating process according to claim 1, wherein the assembly temperature is lower than or equal to the epitaxy temperature to within 10%.

8. The fabricating process according to claim 1, wherein the transparent material of the binding layers is a dielectric.

9. The fabricating process according to claim 1, Wherein the transparent material of the binding layers is silicon-based.

10. The fabricating process according to claim 1, wherein the two bonding sublayers when joined to each other form a metal intermediate layer having an average thickness comprised between 5 nm and 40 nm.

11. The fabricating process according to claim 1, comprising a step of structuring the GeSn-based active layer so as to form a resonant cavity oriented in the plane of the active layer.

\* \* \* \* \*

UNITED STATES PATENT AND TRADEMARK OFFICE
CERTIFICATE OF CORRECTION

PATENT NO. : 11,251,339 B2
APPLICATION NO. : 16/583705
DATED : February 15, 2022
INVENTOR(S) : Reboud et al.

It is certified that error appears in the above-identified patent and that said Letters Patent is hereby corrected as shown below:

On the Title Page

Column 2, Item (57), under "ABSTRACT", Line 10, delete "(Tc)" and insert -- ($T_c$) --, therefore.

Column 2, Item (57), under "ABSTRACT", Line 16, delete "(Tc)," and insert -- ($T_c$), --, therefore.

In the Claims

In Column 18, Claim 2, Line 44, delete "gating," and insert -- grating, --, therefore.

In Column 18, Claim 2, Line 48, delete "gating" and insert -- grating --, therefore.

In Column 18, Claim 6, Line 62, delete "Wherein" and insert -- wherein --, therefore.

In Column 19, Claim 9, Line 13, delete "Wherein" and insert -- wherein --, therefore.

Signed and Sealed this
Twenty-fourth Day of May, 2022

Katherine Kelly Vidal
*Director of the United States Patent and Trademark Office*